US008618561B2

(12) United States Patent
Coe-Sullivan

(10) Patent No.: US 8,618,561 B2
(45) Date of Patent: Dec. 31, 2013

(54) METHODS FOR DEPOSITING NANOMATERIAL, METHODS FOR FABRICATING A DEVICE, AND METHODS FOR FABRICATING AN ARRAY OF DEVICES

(75) Inventor: Seth Coe-Sullivan, Belmont, MA (US)

(73) Assignee: QD Vision, Inc., Lexington, MA (US)

( * ) Notice: Subject to any disclaimer, the term of this patent is extended or adjusted under 35 U.S.C. 154(b) by 528 days.

(21) Appl. No.: 12/317,250

(22) Filed: Dec. 19, 2008

(65) Prior Publication Data

US 2009/0280586 A1 Nov. 12, 2009

Related U.S. Application Data

(63) Continuation of application No. PCT/US2007/014711, filed on Jun. 25, 2007.

(60) Provisional application No. 60/805,735, filed on Jun. 24, 2006.

(51) Int. Cl.
*H01L 33/00* (2010.01)

(52) U.S. Cl.
USPC .......... 257/86; 257/87; 257/88; 257/89; 257/90

(58) Field of Classification Search
USPC ......................................... 257/86
See application file for complete search history.

(56) References Cited

U.S. PATENT DOCUMENTS

| | | |
|---|---|---|
| 5,099,256 A | 3/1992 | Anderson |
| 6,294,401 B1 | 9/2001 | Jacobson et al. |
| 6,322,901 B1 | 11/2001 | Bawendi et al. |
| 6,548,171 B1 | 4/2003 | Barbera-Guillem et al. |
| 6,576,155 B1 | 6/2003 | Barbera-Guillem |
| 6,576,291 B2 | 6/2003 | Bawendi et al. |
| 6,601,944 B1 | 8/2003 | Kawazoe |
| 6,639,527 B2 | 10/2003 | Johnson |
| 6,682,189 B2 | 1/2004 | May et al. |
| 6,737,287 B1 | 5/2004 | Furuse et al. |
| 6,791,259 B1 | 9/2004 | Stokes et al. |
| 6,827,769 B2 | 12/2004 | Auslander et al. |
| 6,876,796 B2 | 4/2005 | Garito et al. |
| 6,887,332 B1 | 5/2005 | Kagan et al. |

(Continued)

FOREIGN PATENT DOCUMENTS

| | | |
|---|---|---|
| WO | WO2006/064896 | 6/2006 |
| WO | WO2008/038867 | 4/2008 |
| WO | WO2008/044100 | 4/2008 |
| WO | WO01/32431 | 5/2010 |

OTHER PUBLICATIONS

Adachi et al., High-efficiency red electrophosphorescence devices, Appl. Phys. Lett. 78, 1622 (2001).

(Continued)

*Primary Examiner* — Julio J Maldonado
*Assistant Examiner* — Mohammad Choudhry

(57) ABSTRACT

A method comprising depositing an ink comprising a nanomaterial and a liquid vehicle from a micro-dispenser onto a layer of a device is disclosed. A method comprising depositing an ink comprising a nanomaterial and a liquid vehicle from a micro-dispenser onto a material capable of transporting charge in a predetermined arrangement is also disclosed. Methods for fabricating devices including nanomaterials are also disclosed. In certain preferred embodiments, the nanomaterial comprises semiconductor nanocrystals. In certain preferred embodiments, a micro-dispenser comprises an inkjet printhead.

14 Claims, 2 Drawing Sheets

(56) References Cited

U.S. PATENT DOCUMENTS

| | | | |
|---|---|---|---|
| 6,957,608 B1 | 10/2005 | Hubert et al. | |
| 6,982,179 B2 | 1/2006 | Kwong et al. | |
| 6,997,539 B2 | 2/2006 | Hoisington et al. | |
| 7,008,559 B2 | 3/2006 | Chen | |
| 7,011,396 B2 | 3/2006 | Moynihan et al. | |
| 7,210,771 B2 | 5/2007 | Neese et al. | |
| 7,294,861 B2 | 11/2007 | Schardt et al. | |
| 7,317,047 B2 | 1/2008 | Hsu | |
| 7,332,211 B1 | 2/2008 | Bulovic et al. | |
| 2001/0001050 A1 | 5/2001 | Miyashita et al. | |
| 2002/0001026 A1 | 1/2002 | Ishikawa et al. | |
| 2002/0047560 A1 | 4/2002 | Lee et al. | |
| 2002/0075422 A1 | 6/2002 | Kimura et al. | |
| 2002/0149659 A1 | 10/2002 | Wu et al. | |
| 2002/0150678 A1 | 10/2002 | Cramer et al. | |
| 2002/0186921 A1 | 12/2002 | Schumacher et al. | |
| 2003/0030706 A1 | 2/2003 | Jagannathan et al. | |
| 2003/0048346 A1 | 3/2003 | Chow | |
| 2003/0067529 A1 | 4/2003 | May et al. | |
| 2003/0140982 A1 | 7/2003 | Seki et al. | |
| 2003/0175411 A1 | 9/2003 | Kodas et al. | |
| 2004/0007169 A1 | 1/2004 | Ohtsu et al. | |
| 2004/0023010 A1 | 2/2004 | Bulovic et al. | |
| 2004/0028875 A1 | 2/2004 | Van Rijn et al. | |
| 2004/0091710 A1 | 5/2004 | Bawendi et al. | |
| 2004/0095658 A1 | 5/2004 | Buretea et al. | |
| 2004/0108808 A1 | 6/2004 | Kumagai et al. | |
| 2004/0110002 A1 | 6/2004 | Kim et al. | |
| 2004/0127135 A1 | 7/2004 | Baek et al. | |
| 2004/0147113 A1 | 7/2004 | Yamazaki et al. | |
| 2004/0149155 A1 | 8/2004 | Thiessen et al. | |
| 2004/0160154 A1 | 8/2004 | Nishimura et al. | |
| 2004/0201664 A1 | 10/2004 | Bringley et al. | |
| 2004/0217696 A1 | 11/2004 | Kim et al. | |
| 2004/0241424 A1 | 12/2004 | Barbera-Guillem | |
| 2004/0265622 A1 | 12/2004 | Sadasivan et al. | |
| 2005/0009224 A1 | 1/2005 | Yang et al. | |
| 2005/0045900 A1 | 3/2005 | Silvernail | |
| 2005/0051777 A1 | 3/2005 | Hill | |
| 2005/0058416 A1 | 3/2005 | Hoon Lee et al. | |
| 2005/0069644 A1 | 3/2005 | Hsieh et al. | |
| 2005/0072989 A1 | 4/2005 | Bawendi et al. | |
| 2005/0074589 A1 | 4/2005 | Pan et al. | |
| 2005/0116621 A1 | 6/2005 | Bellmann et al. | |
| 2005/0126628 A1* | 6/2005 | Scher et al. | 136/263 |
| 2005/0146551 A1 | 7/2005 | Yamazaki et al. | |
| 2005/0157157 A1 | 7/2005 | Tsukamoto et al. | |
| 2005/0186363 A1 | 8/2005 | de Visser et al. | |
| 2005/0214967 A1 | 9/2005 | Scher et al. | |
| 2005/0249901 A1* | 11/2005 | Yializis et al. | 428/35.7 |
| 2005/0250052 A1 | 11/2005 | Nguyen | |
| 2005/0258418 A1 | 11/2005 | Steckel et al. | |
| 2005/0270312 A1 | 12/2005 | Lad et al. | |
| 2005/0272159 A1 | 12/2005 | Ismagilov et al. | |
| 2006/0003114 A1 | 1/2006 | Enlow et al. | |
| 2006/0042685 A1 | 3/2006 | Wang | |
| 2006/0057480 A1 | 3/2006 | Lin et al. | |
| 2006/0144290 A1 | 7/2006 | Polk et al. | |
| 2006/0157720 A1 | 7/2006 | Bawendi et al. | |
| 2006/0196375 A1 | 9/2006 | Coe-Sullivan et al. | |
| 2006/0293409 A1 | 12/2006 | Sanchez et al. | |
| 2007/0001581 A1 | 1/2007 | Stasiak et al. | |
| 2007/0007511 A1 | 1/2007 | Choi et al. | |
| 2007/0085092 A1 | 4/2007 | Chen | |
| 2007/0103068 A1 | 5/2007 | Bawendi et al. | |
| 2007/0281140 A1 | 12/2007 | Haubrich et al. | |
| 2008/0001167 A1 | 1/2008 | Coe-Sullivan et al. | |
| 2008/0074050 A1 | 3/2008 | Chen et al. | |
| 2008/0090928 A1 | 4/2008 | Iftime et al. | |
| 2008/0144333 A1 | 6/2008 | Gourlay | |
| 2008/0150425 A1 | 6/2008 | Cho et al. | |
| 2008/0165235 A1 | 7/2008 | Rolly et al. | |
| 2008/0169753 A1 | 7/2008 | Skipor et al. | |
| 2008/0173886 A1 | 7/2008 | Cheon et al. | |
| 2008/0277626 A1 | 11/2008 | Yang et al. | |
| 2008/0308037 A1 | 12/2008 | Bulovic et al. | |
| 2009/0001385 A1 | 1/2009 | Skipor et al. | |
| 2009/0174022 A1 | 7/2009 | Coe-Sullivan et al. | |
| 2009/0179210 A1 | 7/2009 | Cok | |
| 2009/0181478 A1 | 7/2009 | Cox et al. | |
| 2009/0215208 A1 | 8/2009 | Coe-Sullivan et al. | |
| 2009/0215209 A1 | 8/2009 | Anc et al. | |
| 2009/0278141 A1 | 11/2009 | Coe-Sullivan et al. | |
| 2009/0280586 A1 | 11/2009 | Coe-Sullivan | |
| 2009/0283742 A1 | 11/2009 | Coe-Sullivan et al. | |
| 2009/0283778 A1 | 11/2009 | Coe-Sullivan et al. | |
| 2009/0286338 A1 | 11/2009 | Coe-Sullivan et al. | |
| 2009/0314991 A1 | 12/2009 | Cho et al. | |
| 2010/0051901 A1 | 3/2010 | Kazlas et al. | |
| 2010/0063201 A1 | 3/2010 | Yamamoto | |
| 2010/0134520 A1 | 6/2010 | Coe-Sullivan et al. | |
| 2010/0265307 A1 | 10/2010 | Linton et al. | |

OTHER PUBLICATIONS

Arango, Alexi Cosmos, Thesis of entitled "A Quantum Dot Heterojunction Photodetector" Submitted to the Department of Electrical Engineering and Computer Science, in partial fulfillment of the requirements for the degree of Masters of Science in Computer Science and Engineering at the Massachusetts Institute of Technology, Feb. 2005.

Bulovic, V., et al., Semiconductors and Semimetals 64, 255 (2000).

Coe-Sullivan, S.__MIT, PhD_Thesis_Jun. 2005, "Hybrid Organic/Quantum Dot Thin Film Structures and Devices".

Coe-Sullivan, et al., "Electroluminescence from single monolayers of nanocrystals in molecular organic devices", *Nature*, vol. 420, 19/26 Dec. 2002, p. 800.

Coe-Sullivan, et al., "Large-Area Ordered Quantum-Dot Monolayers via Phase Separation During Spin-Casting", *Adv. Funct. Mater.* 2005, 15, p. 1117-1124.

Coe-Sullivan, at al., "Method for fabrication of saturated RGB quantum dot light emitting devices", Proc. of SPIE, vol. 5739, (2005), p. 108.

Coe-Sullivan, et al., "Tuning the performance of hybrid organic/inorganic quantum dot light-emitting devices", *Organic Electronics*, 4 (2003), p. 123-130.

D'Andrade et al., "Organic Optoelectronic Materials, Processing, and Devices", MRS Fall Meeting, BB6.2 (2001).

Dabbousi of al., << (CdSe) ZnS Core-Shell Quantum Dots : Synthesis and Characterization of a Size Series of Highly Luminescent Nanocrystallites >>, J. Phys. Chem. 101, 9463 (1997).

Dirr et al., "Organic Light Emitting Diodes with Reduced Spectral and Spacial Halfwidths" Jpn. J. Appl. Phys. 37, 1457 (1998).

Kirstein, S., et al., "Herringbone Structures in Two-Dimensional Single Crystals of Cyanine Dyes. I. Detailed Structure Analysis Using Electron Diffraction", *J. Chem. Phys.*, 103(2) Jul. 1995, p. 816.

Kirstein, S., et al., "Herringbone Structures in Two-Dimensional Single Crystals of Cyanine Dyes. II. Optical Properties", *J. Chem. Phys.* 103(2) Jul. 1995, p. 826.

Lin, X., et al, "Formation of Long-range-ordered Nanocrsytal Superlattices on Silicon Nitride Substrates", J. Phys. Chem. B 2001, 105, 3353-3357.

Maenosono, et al., "Overview of nanoparticie array formation by wet coating", *Jnl. Of Nanoparticle Res.*, vol. 5, (2003), p. 5-15.

Mereli, Z., "Connect the quantum dots for a full-colour image", *Nature*, (online) doi: 10.1038/news.2011.109.

Mills, Dr. Ross, Ink Jet as a Manufacturing Process Symposium, iTi Corp. 2008.

Mishra, A., et al. "Cyanines During the 1990s: A Review", *Chem. Rev.* 2000, 100, p. 1973-2011.

Moeller, et al., "Quantum-Dot Light-Emitting Devices for Displays", *Information Display*, OLED materials, 2/06, p. 2-6.

Murray, C., et al., "Synthesis and Characterization of II-VI Quantum Dots and Their Assembly into 3-D Quantum Dot Superlattices", *J. Am. Chem. Soc.*, (1993), 115, p. 8706.

PCT Search Report and Written Opinion for corresponding PCT/US2007/014711 mailed Aug. 19, 2008.

Peyratout, C., et al., "Aggregation of Thiacyanine Derivatives On Polyelectrolytes", Phys. Chem. Chem. Phys., 2002, 4, p. 3032-3039.

(56) References Cited

OTHER PUBLICATIONS

Santhanam, et al., "Self-Assembly of Uniform Monolayer Arrays of Nanoparticles", Langmuir, 19, 7881-7887, (2003).

Sargent, Edward H. "Infrared Quantum Dots" Adv. Mater. 2005, 17, No. 5, Mar. 8, pp. 515.

Schlamp, et al., "Improved efficiencies in light emitting diodes made with CdSe(CdS) core/shell type nanocrystals and a semiconducting polymer", J. Appl. Phys., 82, 5837-5842, (1997).

Schoeppier, M.W.,"Simple Tools for Ink Jet Printing on Flexible Substrates", USDC's 5$^{th}$ An. Flexible Displays & Microelectronics Conf., Phoenix, AZ, Feb. 7-9, 2006.

Sirringhaus, H., et al., "Inkjet Printing of Functional Materials", MRS Bulletin, Nov. 2003, pp. 802-803.

Tullo, A., "Breaking Through", *Chem. & Eng. News*, Business, Feb. 13, 2006, vol. 84, No. 7, p. 45-51.

US Office Action mailed Apr. 23, 2012 in copending U.S. Appl. No. 12/317,255.

Yamasaki et al., "Organic light-emitting device with an ordered monolayer of silica microspheres as a scattering medium", Appl. Phys. Lett. 76, 1243 (2000).

\* cited by examiner

METHODS FOR DEPOSITING NANOMATERIAL, METHODS FOR FABRICATING A DEVICE, AND METHODS FOR FABRICATING AN ARRAY OF DEVICES

This application is a continuation of commonly owned PCT Application No. PCT/US2007/014711 filed 25 Jun. 2007, which was published in the English language as PCT Publication No. WO 2008/108798 on 12 Sep. 2008. The PCT Application claims priority from commonly owned U.S. Patent Application No. 60/805,735 filed 24 Jun. 2006. The disclosures of each of the above-listed applications are hereby incorporated herein by reference in their entireties.

TECHNICAL FIELD OF THE INVENTION

The present invention relates to the technical field of nanomaterials including, but not limited to, methods for depositing a nanomaterial, methods for fabricating devices including a nanomaterial, and method for fabricating an array of devices including a nanomaterial.

SUMMARY OF THE INVENTION

It has been recognized that it would be advantageous to develop new methods for depositing a nanomaterial. It would also be advantageous to develop new methods useful for fabricating a device including a nanomaterial.

In accordance with one aspect of the invention, a method comprises depositing an ink comprising a nanomaterial and a liquid vehicle from a micro-dispenser onto a layer of a device.

In certain embodiments, the ink is deposited in a predetermined arrangement. For example, the ink can be deposited in a patterned or unpatterned arrangement.

In certain embodiments, a nanomaterial comprises inorganic nanoparticles capable of emitting light.

In certain embodiments, a nanomaterial comprises semiconductor nanocrystals. Semiconductor nanocrystals possess characteristics and properties that make them particularly well-suited for use in a variety of devices and other end-use applications, including, but not limited to, light emitting devices, displays, photodetectors, nonvolatile random memory devices, solar cells, sensors, photovoltaic devices, etc.

In certain embodiments, the nanomaterial comprises semiconductor nanocrystals wherein at least a portion of the semiconductor nanocrystals include one or more ligands attached to a surface thereof.

In accordance with a preferred embodiment of the invention, a method comprises depositing an ink comprising a nanomaterial comprising semiconductor nanocrystals and a liquid vehicle from a micro-dispenser onto a layer of a device. In certain embodiments, the layer of the device comprises a material.

In certain embodiments, the ink is deposited in a predetermined arrangement. For example, the ink can be deposited in a patterned or unpatterned arrangement.

In certain embodiments, the method further comprises removal of the liquid vehicle from the ink. In certain embodiments, the liquid vehicle is selected such that, upon removal of the liquid vehicle, the layer(s) of the device are planar.

In certain embodiments, the liquid vehicle comprises a liquid in which the material included in the layer onto which the ink is deposited is insoluble.

In certain embodiments, the liquid vehicle comprises a liquid in which the material included in the layer onto which the ink is deposited is at least partially soluble.

In certain embodiments, the material included in the layer is sufficiently soluble in the liquid such that at least a portion of the nanomaterial can become at least temporarily mixed in the portion of the material that dissolves in the liquid. In certain embodiments, the liquid can be removed such that at least a portion of the material and the nanomaterial remain mixed. In certain embodiments, the liquid can be removed such that the nanomaterial phase separates to form a layer of nanomaterial at or near the surface of the layer.

In certain embodiments, the layer of the device onto which the ink is deposited comprises a material capable of transporting charge.

In certain embodiments, the layer of the device onto which the ink is deposited comprises a small molecule material. A "small molecule" material refers to any organic material that is not a polymer. A small molecule material can further include a metal. A small molecule can include an organometallic compound. A small molecule material can include a metal complex. A small molecule material can include repeating units in some circumstances. For example, using a long chain alkyl group as a substituent does not remove a molecule from the "small molecule" class. Other examples of small molecule materials can include organic oligomer molecules (e.g., organic molecules of intermediate relative molecular mass, the structure of which essentially comprises a small plurality of units derived, actually or conceptually, from molecules of lower relative molecular mass, see "oligomer molecule" from IUPAC Compendium of Chemical Terminology $2^{nd}$ Edition (1997) including related Notes, which are hereby incorporated herein by reference.)

In certain embodiments, a small molecule material may serve as the core moiety of a dendrimer, which includes a series of chemical shells built on the core moiety. The core moiety of a dendrimer may be a fluorescent or phosphorescent small molecule emitter.

Dendrimer substituents can also be used to enhance the ability of small molecules to undergo solution processing.

In certain embodiments, the layer of the device onto which the ink is deposited comprises a polymer.

In certain embodiments, the layer of the device onto which the ink is deposited can comprise an organic nanocrystal. Examples of organic nanocrystals include, without limitation, J-aggregates, H-aggregates, and organic nanocrystals including aggregates with other dipole arrangements. Examples of organic nanocrystals are described in S. Kirstein et al., "Herringbone Structures In Two-Dimensional Single Crystals of Cyanine Dyes. I. Detailed Structure Analysis Using Electron Diffraction", J. Chem. Phys. 103(2) July 1995, pages 816 et seq.; S. Kirstein et al., "Herringbone Structures In Two-Dimensional Single Crystals of Cyanine Dyes. II. Optical Properties", J. Chem. Phys. 103(2) July 1995, pages 826 et seq.; A. Mishra et al. "Cyanines During the 1990s: A Review", Chem. Rev. 2000, 100, 1973-2011; and C. Peyratout et al., "Aggregation of Thiacyanine Derivatives On Polyelectrolytes, Phys. Chem. Chem. Phys., 2002, 4, 3032-3039, the disclosures of which are hereby incorporated herein by reference in their entireties.

In certain embodiments, the layer of the device onto which the ink is deposited comprises carbon nanotubes.

In certain embodiments, the layer of the device onto which the ink is deposited comprises a carbon nanotube/polymer blend or hybrid.

In certain embodiments, the layer of the device onto which the ink is deposited comprises an inorganic material.

The layer of the device onto which the ink is deposited can be disposed over a substrate which may also include an electrode and/or one or more other layers.

In certain embodiments, the method can further include depositing a second electrode layer over the nanomaterial. The deposition of one or more additional layers (including, for example, hole blocking layer, electron transport layer, electron injection layer, etc.) can also optionally be included before or after deposition of the second electrode layer. Passivation, packaging, etc. can also optionally be included.

In accordance with another aspect of the invention, a method comprises depositing an ink comprising a nanomaterial and a liquid vehicle from a micro-dispenser onto a material capable of transporting charge. In certain embodiments, the ink is deposited in a predetermined arrangement. For example, the ink can be deposited in a patterned or unpatterned arrangement.

In certain embodiments of the invention, the nanomaterial comprises inorganic nanoparticles capable of emitting light.

In certain embodiments of the invention, the nanomaterial comprises semiconductor nanocrystals. Semiconductor nanocrystals possess characteristics and properties that make them particularly well-suited for use in a variety of devices and other end-use applications, including, but not limited to, light emitting devices, displays, photodetectors, nonvolatile random memory devices, solar cells, sensors, photovoltaic devices, etc. In certain embodiments, the nanomaterial comprises semiconductor nanocrystals wherein at least a portion of the semiconductor nanocrystals include one or more ligands attached to a surface thereof.

In certain embodiments, the ink is deposited in a predetermined arrangement. For example, the ink can be deposited in a patterned or unpatterned arrangement.

In certain embodiments, the method further comprises removal of the liquid vehicle from the ink. In certain more detailed embodiments, the liquid vehicle is selected such that, upon removal of the liquid vehicle, the surface of the material including the nanomaterial deposited thereon is planar.

In certain embodiments, the liquid vehicle comprises a liquid in which the material is insoluble.

In certain embodiments, the liquid vehicle comprises a liquid in which the material capable of transporting charge is at least partially soluble.

In certain embodiments, the material capable of transporting charge is sufficiently soluble in the liquid such that at least a portion of the nanomaterial can become at least temporarily mixed in the portion of the material that dissolves in the liquid. In certain more detailed embodiments, the liquid can be removed such that at least a portion of the material and the nanomaterial remain mixed. In certain embodiments, the liquid can be removed such that the nanomaterial phase separates to form a layer of nanomaterial at or near the surface of the material.

In accordance with another aspect of the invention there is provided a method of fabricating a device. The method comprises depositing an ink including semiconductor nanocrystals and a liquid vehicle from a micro-dispenser over a substrate including an electrode. The substrate may optionally include one or more additional layers and/or features. In another detailed aspect, following deposition onto the substrate, the liquid vehicle is removed from the ink. In another detailed aspect, one or more additional layers and/or features are disposed over the semiconductor nanocrystals. In certain embodiments, the ink is deposited in a predetermined arrangement. For example, the ink can be deposited in a patterned or unpatterned arrangement.

In accordance with another aspect of the invention, there is provided a method for forming an array of devices comprising: depositing an ink comprising a nanomaterial comprising semiconductor nanocrystals and a liquid vehicle from a micro-dispenser over a substrate. The substrate may optionally include one or more additional layers and/or features. In another detailed aspect, following deposition onto the substrate, the liquid vehicle is removed from the ink. In another detailed aspect, one or more additional layers and/or features are disposed over the semiconductor nanocrystals. In certain embodiments two or more inks including different light-emissive materials are deposited in a predetermined arrangement. For example, the ink can be deposited in a patterned or unpatterned arrangement.

In certain embodiments, the substrate can be a top or bottom surface of a light emitting device or other lighting unit.

In certain aspects and embodiments of the present invention, the liquid vehicle comprises a composition including one or more functional groups that are capable of being cross-linked by UV or thermal treatment or another cross-linking technique readily ascertainable by a person of ordinary skill in a relevant art.

The foregoing, and other aspects described herein all constitute embodiments of the present invention.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
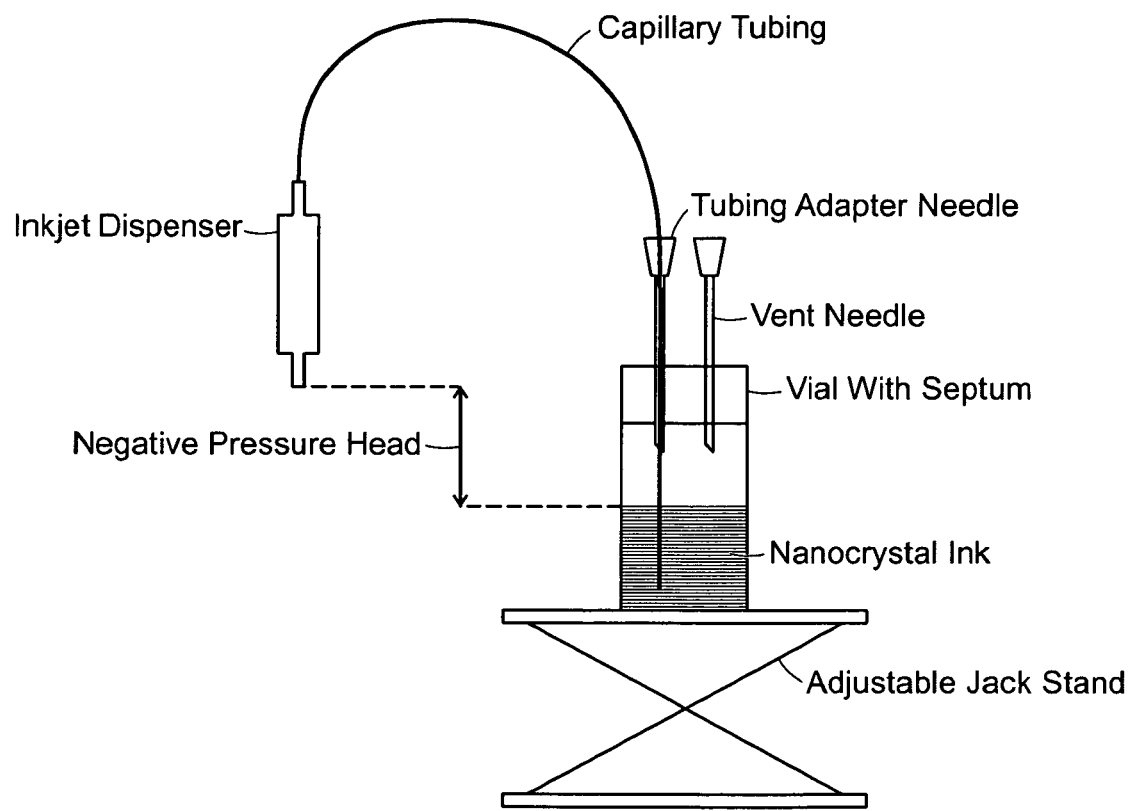
FIG. 1 depicts a schematic of an example of an equipment set-up for use in carrying out an embodiment of a method in accordance with the invention.

The attached figures are simplified representations presented for purposed of illustration only; the actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

In accordance with one aspect of the invention, a method comprises depositing an ink comprising a nanomaterial and a liquid vehicle from a micro-dispenser onto a layer of a device. In certain embodiments, the ink is deposited in a predetermined arrangement. For example, the ink can be deposited in a patterned or unpatterned arrangement.

In accordance with another aspect of the invention, a method comprises depositing an ink comprising a nanomaterial comprising semiconductor nanocrystals and a liquid vehicle from a micro-dispenser onto a layer of a device. In certain embodiments, the ink is deposited in a predetermined arrangement. For example, the ink can be deposited in a patterned or unpatterned arrangement.

In accordance with another aspect of the invention, a method comprises depositing an ink comprising a nanomaterial and a liquid vehicle from a micro-dispenser onto a material capable of transporting charge. In certain embodiments, the ink is deposited in a predetermined arrangement. For example, the ink can be deposited in a patterned or unpatterned arrangement.

It is believed that the present invention can offer significant advantages, especially, for example, for devices including large substrates, e.g., larger than about 0.5 meters in at least one dimension and/or when predetermined arrangements of nanomaterial are desired.

In certain embodiments, the ink can be deposited from a micro-dispenser, such as an inkjet printhead of an inkjet printing system. Inkjet printing can allow a pattern of ink including a nanomaterial to be conveniently formed on a layer of a device. Inkjet printing can allow precise control over the location and size of inked areas that are printed. Ink spots of about 20 μm in size are readily achievable today by commercially available inkjet printers, and smaller spot sizes are expected to be possible. Different nanomaterials can be patterned simultaneously using an inkjet printing system having multiple print heads. Thus, multiple nanomaterials can be deposited in a single deposition step. This avoids the need to register subsequent depositions to a previously deposited pattern.

An inkjet printing system for use in depositing a nanomaterial can include a printhead having a firing chamber reservoir containing an ink. In one embodiment, an inkjet printing system, for example, can be used to propel the ink onto the material or device layer to be printed using resistive heating elements or piezoelectric elements for propelling the composition through an overlying orifice plate. The ink can be stored in a reservoir and the composition can travel through a set of micro-channels toward the orifice plate. The printhead can have a firing chamber reservoir containing the ink.

Examples of inkjet printing systems for use in carrying out the methods of the invention include, without limitation, Dimatix Materials Printer DMP-2800 Series including Dimatix Materials Cartridge DMC-1000 Series, of Dimatix, Inc., Santa Clara, Calif. Inkjet printing systems from other manufacturers may also be useful in carrying out the methods of the invention. See also inkjet printing systems described in U.S. Pat. No. 6,997,539 for "Apparatus for Depositing proplets" of Hoisington et al. (assigned to Dimatix, Inc.), issued on 14 Feb. 2006; U.S. Pat. No. 7,011,936 for "Piezoelectric Ink Jet Module With Seal" of Moynihan et al. (assigned to Dimatix, Inc.), issued on 14 Mar. 2006. The foregoing patents are hereby incorporated herein by reference in their entirety. Examples of other inkjet printing systems include the Omnidot printer available from the Xaar Corporation headquartered in Cambridge, UK. Another example of a nozzle array is a multi-jet nozzle system that includes 126 jets and is sold under the part number XJ126 by Xaar Corporation. Furthermore, an atomization spray process using an ultrasonic spray head to dispense ink droplets may be employed. Additionally, for inks with high viscosities, e.g., 20 centipoise or greater, the Leopard available from the Xaar Corporation may be employed, wherein the ink may be heated to reduce the viscosity to a jettable range.

An example of another inkjet system which is more suitable to research and development needs is the Active Pipette™ piezo system available from Engineering Arts.

An inkjet printing system can include, for example, a data interface, a control subsystem, a positioning subsystem, and a depositing subsystem. It should be appreciated that in other embodiments of the invention, an ink including a nanomaterial comprising semiconductor nanocrystals and a liquid vehicle may be deposited onto a material or device layer by any of a variety of other delivery systems including one or more micro-dispensers, including but not limited to thermal ejection, piezoelectric ejection, aerosol generation, micropipettes, pipettes, ultrasonic heads, etc. that can be configured to dispense a selected volume of solution with the desired application parameters.

Current inkjet technology allows for orifice sizes of from about 15 μm to about 100 μm. Thus, the minimum size of the features that can be deposited is currently limited to about this range, although future developments may allow for smaller orifice sizes and decreased sizes. Additionally, the size of the orifice can affect the practical size of any nanomaterial present in the ink to be inkjetted.

In certain embodiments, inkjetting techniques can include an ink formulation which is tailored to various inkjet pens, including thermal, piezoelectric, sonic impulse, or other known inkjet printing systems. As discussed above, an ink can further include a variety of components such as those typically used in inkjet liquid vehicles, such as, but not limited to solvents, cosolvents, surfactants, biocides, buffers, viscosity modifiers, sequestering agents, colorants, stabilizing agents, humectants, scatterers, fillers, extenders, water, and mixtures thereof. Several considerations in selecting the amount of liquid vehicle include those related to nucleation such as heat capacity, heat of vaporization, critical nucleation temperature, diffusivity, and the like. Typically, an ink for use in thermal inkjet printing systems can have a viscosity of from about 0.8 cP to about 20 cP, and in some cases, can be up to 50 cP. Similarly, an ink for use in piezoelectric inkjet printing systems can have a viscosity of from about 2 cP to about 15 cP, and in some cases, can be up to 30 cP. Optionally, a viscosity modifier can be included in the ink. Examples of viscosity modifiers include 2-pyrrolidone, isopropyl alcohol, glycerol, and the like. However, other viscosity modifiers can be used.

The surface tension of an ink used in thermal inkjet printing systems can range from about 25 dyne/cm to about 75 dyne/cm, and in some embodiments, can be from about 30 to about 55 dyne/cm. The surface tension can be adjusted using compounds such as isopropyl alcohol, ethanol, methanol, glycerol, and the like. In certain embodiments, the liquid vehicle can include from about 60 wt % to about ~100 wt % of the ink. Various techniques can be used to modify the viscosity or other jetting properties of the ink. For example, heat can be used to liquefy material, increase solubility of the material, or reduce viscosity such that it becomes inkjettable. Those skilled in the art will recognize that the above discussion is primarily focused on thermal inkjet printing systems; piezoelectric inkjet printing systems involve less restrictive considerations. For example, thermal inkjet printing systems are typically operated at temperatures below about 80° C., while piezoelectric inkjet printing systems can be operated at temperatures of up to about 150° C. Those skilled in the art will recognize which components can be included in the liquid vehicle in order to inkjet an ink from thermal, piezoelectric, or other inkjet printing systems. Those skilled in the art can adjust these and other variables to achieve a variety of resolutions and conductive paths. Printhead waveforms (e.g., piezo and thermal excitation waveforms, anti-clogging waveforms, ejection waveforms, etc.), and the compositions of the materials used to construct the printhead and orifice plate are among such variables. For example, depending on the wetting attributes of the ink and the wettability of the internal surface of the inkjet nozzle or the surface of the printing orifice plate, the ink composition can be treated to enhance drop ejection.

In certain embodiments of the inventions described herein, it may be beneficial to use a vehicle system which would result in ink properties falling outside the normal ranges described above. This would be the case, for example, if one were to use a vehicle in which the material of the device is insoluble. An example of a class of solvents that meet this criterion are fluorinated solvents, such as perfluorodecalin, or the Fluorinert series of solvents sold by 3M. In creating inks from such solvents, the surface tension and viscosity may fall below those normally required for inkjet. Fluorinert FC-77, for example, has a surface tension of 13 dyne/cm and a viscosity of 1.3 cP. A method to more consistently jet inks made with these solvents includes creating a negative pressure (relative to atmospheric) inside the cartridge reservoir to form a jet that is more stable. This can be accomplished at laboratory scale by placing the cartridge reservoir slightly below the inkjet nozzle. The positioning of the cartridge reservoir to achieve a sufficient negative pressure therein to form a jet can be readily determined by one of ordinary skill in the art. Preferably, the inkjet cartridge reservoir is held by or positioned relative to the inkjet nozzle(s) such that the height of inkjet cartridge reservoir can be adjusted to obtain the desired negative pressure inside the cartridge reservoir. In one example, the cartridge reservoir is positioned on a variable-height platform (e.g., a small jack), the height of which can be adjusted to obtain a=negative air pressure inside the cartridge reservoir, preferably a slight negative pressure. A schematic diagram of an example of a laboratory-scale set-up is shown in FIG. 1. In certain embodiments, semiconductor nanocrystals included in a fluorinated solvent include one or more fluorinated ligands attached to a surface of the nanocrystals. Nanocrystals including fluorinated ligands can be prepared by exchanging at least one or more ligands that become attached to a nanocrystal surface during, e.g., colloidal synthesis, with ligands that include a functional head such as, by way of example, a thiol, carbodithioate, carbodithioic acid, amine, thiourea, amide, phosphine oxide, phosphonic or phosphinic acid, thiophosphonic or thiophosphinic acid, which functional head can be substituted with alkyl and/or aryl units that are perfluorinated or partially fluorinated. Preferably the fluorinated ligand is chemically compatible with the fluorinated liquid vehicle.

Deposition of nanomaterial onto the surface to be printed in the form of ejected drops produces a "dot" of ink comprising a nanomaterial and liquid vehicle thereon. The term "dot" is used to refer to the ink drop once it contacts the surface. In some examples, the ink in the drop will stay in a thin layer on the surface. However, depending on the porosity, wettability, and/or other attributes of the device layer, and when the drop contacts the layer, the ink can spread outwardly resulting in dot gain. Dot gain is the ratio of the final diameter of a dot on the surface to its initial diameter. If the material or layer onto which the ink is deposited is porous, the dot can penetrate into the material or layer. Dot penetration is the depth that the drop soaks into the surface on which it is deposited. The physical and/or chemical properties of the dots can enhance dissolution rates without disrupting the permeability and specificity of the ink. Controlled dot placement, high surface-to-mass ratio of the dots, and digital mass deposition control of the dots can be used to address performance of the deposited nanomaterial in the device.

For example, a dot has virtually no dot gain or dot penetration, as may be the case, when an ejection solution is applied to a delivery substrate having a nonwettable, surface, or a relatively impermeable surface.

One convenient way of quantifying the nature of the interaction between the ink forming the dot and the surface onto which it is deposited, is to measure the angle θ formed by the liquid-solid and the liquid-air interfaces. This angle, referred to as the contact angle, is a product of the surface tension of the solution as well as the wettability of the surface onto which the ink is deposited. Inks including a liquid vehicle having a high surface tension, and poor interaction with the surface of the device layer to be printed tend to exhibit contact angles greater than 90°. The ink then tends to form discrete droplets on the surface. However, where the liquid vehicle is relatively nonpolar, as is typically the case with an organic liquid, and the surface onto which the ink is deposited device layer is similarly nonpolar, the contact angle is typically less than 90°, and the liquid tends to spread out and form a thin film. As the dot spreads out and thins, the contact angle tends to zero.

As described above, an inkjet printing system may be adapted to deposit one or more different nanomaterials comprising different semiconductor nanocrystals, which may be included in corresponding inks. In some embodiments, two or more ejection cartridges can be configured for each to deposit an ink including a different nanomaterial and/or eject ink having different drop volumes. The inkjet system may be configured to interchangeably receive different ejection cartridges, which are individually configured to apply the same of different ink to the surface being printed. Interchangeable ejection cartridges may also be used to replace an empty ejection cartridge with a full ejection cartridge. It is within the scope of this disclosure to utilize other mechanisms for depositing an ink including a nanomaterial and a liquid vehicle onto a material or layer of a device, and ejection cartridge is provided as a nonlimiting example. For example, an inkjet system may include an ejection cartridge that utilizes an ejection-head having ejectors configured to effectuate fluid ejection via a nonthermal mechanism, such as vibrational displacement caused by a piezoelectric ejection element.

In one example of an inkjet system that may be useful in carrying out methods in accordance with the invention, the nozzle spacing can be about 504 μm; the nozzle diameter can be about 27 μm; and the droplet size (for 12 pl) spreads to minimum size ~5 μm square.

Based on estimated nozzle life, a nozzle can be expected to coat an area of about 807 ft2. This area corresponds to printing 29,000 two-inch squares or 3,200 six inch square displays. The range of fluid viscosities that can be inkjet printed includes, for example, 8-14 cP. Printing at operating temperatures over 70° C. may be limited by the specific materials and equipment used.

Depending upon the drop volume, contact angle, viscosity, and other properties of the ink, even with a drop volume as small as ~8 pl, the spot diameter can be relatively large due to rapid spreading. Similarly, depending upon the drop volume, contact angle, viscosity, and other properties of the ink, in some instances, to print a linear pattern from an inkjet printing system, repeat printing of drops in an overlapping arrangement may be appropriate.

As discussed above, an ink useful for depositing nanomaterial from a micro-dispenser includes nanomaterial and a liquid vehicle. In certain embodiments, the liquid vehicle comprises a liquid in which the nanomaterial can be dispersed or suspended. In certain preferred embodiments, the nanomaterial is colloidally dispersed. In certain embodiments, the liquid vehicle comprises a liquid in which the nanomaterial does not dissolve or does not appreciably dissolve (e.g., solubility is less than 0.001 mg/ml).

In certain embodiments including a nanomaterial with one or more ligands attached to a surface of at least a portion of the nanoparticles thereof, the liquid vehicle comprises a liquid in which such nanomaterial with attached ligands can be dispersed or suspended. In certain preferred embodiments, the nanomaterial is colloidally dispersed. In certain embodiments, the nanoparticles comprise semiconductor nanocrystals. In certain embodiments, the liquid vehicle is one in which the ligands (when not attached to nanoparticles) are at least partially soluble. In certain embodiments, the liquid vehicle is one in which the ligands (when not attached to nanoparticles) are insoluble.

In certain embodiments, the ink includes a liquid vehicle in which the material or device layer onto which the ink is to be deposited is insoluble (e.g., <0.001/mg/ml of the material dissolves in the liquid vehicle). In other certain embodiments, the ink includes a liquid vehicle in which the material or device layer onto which the ink is to be deposited is at least partially soluble (e.g., >0.001 mg/ml of the material dissolves in the liquid vehicle). In certain embodiments, at least a portion of the nanomaterial can become at least temporarily mixed in the portion of the material or layer that dissolves in the ink.

In certain embodiments, the method further comprises removal of the liquid vehicle from the ink.

In certain embodiments, the liquid vehicle can be removed such that at least a portion of the material or layer and the nanomaterial remain mixed.

In another embodiment, the liquid vehicle can be removed such that the nanomaterial phase separates to form a layer of nanomaterial at or near the surface of the underlying material or layer. Phase separation is described in more detail in U.S. patent application Ser. No. 10/400,907 for "Layered Materials Including Nanoparticles" of Bulovic et al. filed on 28 Mar. 2003, which is hereby incorporated herein by reference in its entirety.

In certain embodiments, the liquid vehicle of the ink is selected such that, upon removal of the liquid vehicle, the material or layer(s) of the device including the nanomaterial deposited thereon is planar. An example of a technique for achieving a planar material or device layer involves utilizing a well structure such as typically used in PLED technology. Other techniques can be readily determined by one of ordinary skill in the relevant art. One technique for measuring planarity is by measuring peak-to-peak height difference. This can be readily measured using an AFM microscope. In certain embodiments, a planar layer has a peak-to-peak height difference less than about 5%.

Examples of a liquid vehicle for inclusion in an ink including a nanomaterial (e.g., a nanomaterial comprising semiconductor nanocrystals) include, without limitation, those listed in the following Table 1, and mixtures of two or more thereof.

Examples of mixtures include, but are not limited to, hexane and octane; benzene and xylene; tetrahydrofurane and anisole; etc.

TABLE 1

| Liquid | Formula | Viscosity @ 25° C. | Boiling Point @ 1 atm | Relative Polarity (compared to water) |
| --- | --- | --- | --- | --- |
| cyclohexane | $C_6H_{12}$ | 0.89 | 80.7 | 0.006 |
| pentane | $C_5H_{12}$ | 0.24 | 36.1 | 0.009 |
| Hexane | $C_6H_{14}$ | 0.30 | 69 | 0.009 |
| heptane | $C_7H_{16}$ | 0.91 | 98 | 0.012 |
| Carbon tetrachloride | $CCl_4$ | 0.91 | 76.7 | 0.052 |
| p-xylene | $C_8H_{10}$ | 0.63 | 138.3 | 0.074 |
| toluene | $C_7H_8$ | 0.56 | 110.6 | 0.099 |
| Benzene | $C_6H_6$ | 0.60 | 80.1 | 0.111 |
| Diethyl ether | $C_4H_{10}O$ | 0.22 | 34.6 | 0.117 |
| Methyl t-butyl alcohol | $C_5H_{12}O$ |  | 55.2 | 0.148 |
| Dioxane | $C_4H_8O_2$ | 1.21 | 101.1 | 0.164 |
| tetrahydrofurane (THF) | $C_4H_8O$ | 0.47 | 66 | 0.207 |
| ethyl acetate | $C_4H_8O_2$ |  | 77 | 0.228 |
| dimethoxy-ethane (glyme) | $C_4H_{10}O_2$ |  | 85 | 0.231 |
| Diglyme | $C_6H_{14}O_3$ |  | 162 | 0.244 |
| chloroform | $CHCl_3$ | 0.54 | 61.2 | 0.259 |
| methylene chloride | $CH_2Cl_2$ | 0.43 | 39.8 | 0.309 |
| 2-butanone | $C_4H_8O$ |  | 79.6 | 0.327 |
| Acetone | $C_3H_6O$ | 0.31 | 56.2 | 0.355 |
| t-butyl alcohol | $C_4H_{10}O$ |  | 82.2 | 0.389 |
| dimethyl-formamide (DMF) | $C_3H_7NO$ |  | 153 | 0.404 |
| dimethyl sulfoxide (DMSO) | $C_2H_6OS$ |  | 189 | 0.444 |
| Acetonitrile | $C_2H_3N$ | 0.35 | 81.6 | 0.46 |
| 2-propanol | $C_3H_8O$ | 2.40 | 82.4 | 0.546 |
| 1-butanol | $C_4H_{10}O$ | 3.00 | 117.6 | 0.602 |
| 1-propanol | $C_3H_8O$ | 1.95 | 97 | 0.617 |
| acetic acid | $C_2H_4O_2$ |  | 118 | 0.648 |
| ethanol | $C_2H_6O$ | 1.20 | 78.5 | 0.654 |
| diethylene glycol | $C_4H_{10}O_3$ | 35.70 | 245 | 0.713 |
| Methanol | $CH_4O$ | 0.59 | 64.6 | 0.762 |
| ethylene glycol | $C_2H_6O_2$ | 16.90 | 197 | 0.79 |
| Glycerin | $C_3H_8O_3$ | 1410.00 | 290 | 0.812 |
| water, heavy (D2O) | $D_2O$ |  | 101.3 | 0.991 |
| Water | $H_2O$ | 1.00 | 100 | 1 |
| Nonane | $(CH_3(CH_2)_7CH_3)$ | 0.67 | 39.0 |  |
| Decane | $C_{10}H_{22}$ | 0.84 | 174.1 |  |
| Dodecane | $C_{12}H_{26}$ | 1.25 | 216.2 |  |
| Chlorobenzene | $C_6H_5Cl$ | 0.75 | 132 |  |
| Dichlorobenzene | $C_6H_4Cl_2$ | — | 174.0 |  |
| Anisole | $C_7H_8O$ | 0.92 | 154.0 |  |
| Dimethyl formamide | $HCON(CH_3)_2$ | 0.79 | 149.56 |  |
| 1-Methyl-2-pyrrolidinone |  | 1.7 | 204.5 |  |
| Carbon tetrachloride | $CCl_4$ | 0.91 | 76.8 |  |
| 1,1,1-Trichloroethane | $CH_3CCl_3$ | 0.73 | 74.0 |  |

TABLE 1-continued

| Liquid | Formula | Viscosity @ 25° C. | Boiling Point @ 1 atm | Relative Polarity (compared to water) |
|---|---|---|---|---|
| Tetrachloroethylene | ClCH=CCl$_2$ | 0.57 | 87.0 | |
| Ethylbenzene | C$_8$H$_{10}$ | 0.67 | 136.0 | |
| Fluorinert FC-77 (a 3M product) | | 1.3 | 97.0 | |

Other liquids or mixtures of liquids can be used as a liquid vehicle. In certain embodiments, volatile liquids or mixtures of volatile liquids can be used as a liquid vehicle.

In certain embodiments, an ink including a nanomaterial and a liquid vehicle has a viscosity in a range of from about 0.1 centipoise (e.g., that of diethyl ether, methanol) to greater than 1500 centipoise (e.g., that of oils, glycerol).

In certain embodiments including a nanomaterial comprising semiconductor nanocrystals, the liquid vehicle comprises an organic non-polar liquid. In certain embodiments, the liquid vehicle has a viscosity less than or equal to about 1 cP and also relatively high volatility.

In certain embodiments of the inventions described herein, it is not necessary to have the nanomaterial particles (e.g., semiconductor nanocrystals) individually dispersed in the vehicle. The nanomaterial particles (e.g., semiconductor nanocrystals may be aggregated. In certain embodiments of the inventions described herein, the nanomaterial particles (e.g., semiconductor nanocrystals) may be included within or adsorbed onto polymer particles. In certain embodiments of the inventions described herein, the nanomaterial particles (e.g., semiconductor nanocrystals) may be included within or adsorbed onto a matrix. The matrix can be polymeric or non-polymeric.

Optionally, other components can be included in the ink. Examples of other components that can be optionally included in the ink include, but are not limited to, e.g., surfactants, solvents, co-solvents, buffers, biocides, viscosity modifiers, complexing agents, chelating agents, stabilizing agents (e.g., to inhibit agglomeration of the nanomaterial), humectants, scatterers, fillers, extenders etc. Other possible components include other additives of the type that may be included in ink or inkjet ink compositions. Stabilizing agents can include, e.g., chemically attached functional groups or ligands to form a coating around individual nanoparticles.

The amount (e.g., concentration (wt/vol)) of nanomaterial included in an ink can be selected based upon the particular nanomaterial and desired attributes of the deposited nanomaterial (e.g., thickness, optical density, features of the deposited nanomaterial (e.g., patterned or unpatterned, sizes of the features of a pattern, etc.)). The amount can be readily determined by a person of ordinary skill in the art.

For example, in certain embodiments of inks including a nanomaterial comprising semiconductor nanocrystals and a liquid vehicle (including, e.g., but not limited to, a liquid vehicle comprising non-polar organic liquid or liquid mixture), the ink can include at least about 0.1 mg/ml semiconductor nanocrystals. In examples of other embodiments, the ink can include at least 1 mg/ml, at least 5 mg/ml, at least 10 mg/ml, at least 25 mg/ml; at least 50 mg/ml, etc.

In certain embodiments, the nanomaterial and any other optional components are dispersed in the ink when deposited. In certain preferred embodiments, the dispersion is colloidal.

A nanomaterial includes nanoparticles having an average maximum dimension smaller than 100 nm.

In certain preferred embodiments, the nanomaterial comprises semiconductor nanocrystals.

Semiconductor nanocrystals comprise nanometer-scale inorganic semiconductor particles. Semiconductor nanocrystals preferably have an average nanocrystal diameter less than about 150 Angstroms (Å), and most preferably in the range of 12-150 Å.

Semiconductor nanocrystals include, for example, inorganic crystallites between about 1 nm and about 1000 nm in diameter, preferably between about 2 nm and about 50 nm, more preferably about 5 nm to about 20 nm (such as about 6, 7, 8, 9, 10, 11, 12, 13, 14, 15, 16, 17, 18, 19, or 20 nm).

The semiconductor forming the semiconductor nanocrystals can comprise a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys of any of the foregoing, and/or mixtures of any of the foregoing, including ternary and quaternary mixtures and/or alloys. Examples include, but are not limited to, ZnO, ZnS, ZnSe, ZnTe, MgO, MgS, MgSe, MgTe, CdO, CdS, CdSe, CdTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbO, PbS, PbSe, PbTe, Si, Ge, other Group IV elements, and/or mixtures or alloys thereof, including ternary and quaternary mixtures or alloys.

Examples of the shape of semiconductor nanocrystals include sphere, rod, disk, other shape or mixtures thereof.

Preferably, the semiconductor nanocrystals include a "core" of one or more first semiconductor materials, which may be surrounded by an overcoating or "shell" of one or more second semiconductor materials. A semiconductor nanocrystal core surrounded by a semiconductor shell is also referred to as a "core/shell" semiconductor nanocrystal.

For example, the semiconductor nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as semiconductor nanocrystal cores include, but are not limited to, CdO, CdS, CdSe, CdTe, ZnO, ZnS, ZnSe, ZnTe, MgO, MgS, MgSe, MgTe, GaAs, GaP, GaSb, GaN, HgO, HgS, HgSe, HgTe, InAs, InP, InSb, InN, AlAs, AlP, AlSb, AlS, TlN, TlP, TlAs, TlSb, PbO, PbS, PbSe, Ge, Si, other Group IV elements, and/or mixtures or alloys thereof, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys of any of the foregoing, and/or mixtures of any of the foregoing, including ternary and quaternary mixtures and/or alloys. Examples include, but are not limited to, ZnO, ZnS, ZnSe, ZnTe, CdO, CdS, CdSe, CdTe, MgO, MgS, MgSe, MgTe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Si, Ge, other Group IV elements, and/or mixtures and/or alloys thereof, including ternary and quaternary mixtures and/or alloys. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, overcoated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness of from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain embodiments, the surrounding shell material can have a band gap less than the band gap of the core material.

In certain embodiments, the shell can be chosen so as to have an atomic spacing close to that of the "core" substrate. In certain embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell.

Additional examples of core/shell semiconductor structures are described in U.S. application Ser. No. 10/638,546, for "Semiconductor Nanocrystal Heterostructures", filed 12 Aug. 2003, and U.S. Published Patent Application No. US 2004-0023010 A1, for "Light Emitting Device Including Semiconductor Nanocrystals" of Bulovic et al. The foregoing applications are hereby incorporated herein by reference in its entirety.

Preparation and manipulation of semiconductor nanocrystals are described, for example, in U.S. Pat. Nos. 6,322,901 and 6,576,291, and U.S. Patent Application No. 60/550,314, each of which is hereby incorporated herein by reference in its entirety. One method of manufacturing a semiconductor nanocrystal is a colloidal growth process. Colloidal growth occurs by injection an M donor and an X donor into a hot coordinating solvent. One example of a preferred method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals that can be obtained has a narrow, monodisperse distribution of diameters. The monodisperse distribution of diameters can also be referred to as a size. Preferably, a monodisperse population of particles includes a population of particles wherein at least 60% of the particles in the population fall within a specified particle size range. A population of monodisperse particles preferably deviate less than 15% rms (root-mean-square) in diameter and more preferably less than 10% rms and most preferably less than 5%.

In certain embodiments, the preparation of semiconductor nanocrystals can be carried out in the presence of an amine. See, for example, U.S. Pat. No. 6,576,291 for "Preparation of Nanocrsytallites" of Bawendi et al. issued 10 Jun. 2003, which is hereby incorporated herein by reference in its entirety.

The narrow size distribution of the semiconductor nanocrystals allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 for "Highly Luminescent Color-Selective Materials". The foregoing are hereby incorporated herein by reference in their entireties.

The process of controlled growth and annealing of the semiconductor nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened. The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. The X donor can be a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis (trimethylsilyl) selenide ((TMS)$_2$Se), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-noctylphosphine) sulfide (TOPS), an ammonium salt such as an ammonium halide (e.g., NH4Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A coordinating solvent can help control the growth of the semiconductor nanocrystal. The coordinating solvent is a compound having a donor lone pair that, for example, has a lone electron pair available to coordinate to a surface of the growing semiconductor nanocrystal. Solvent coordination can stabilize the growing semiconductor nanocrystal. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. Examples of suitable coordinating solvents include pyridine, tri-n-octyl phosphine (TOP), tri-n-octyl phosphine oxide (TOPO) and trishydroxylpropylphosphine (tHPP). Technical grade TOPO can be used. Non-coordinating solvents can also be used.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the semiconductor nanocrystals can be further refined by size selective precipitation with a poor solvent for the semiconductor nanocrystals, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

As discussed herein, in certain embodiments, the nanomaterial comprises semiconductor nanocrystals wherein at least a portion of the semiconductor nanocrystals include one or more ligands attached to a surface thereof.

In one embodiment, the ligands are derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

The organic ligands can be useful in facilitating large area, non-epitaxial deposition of highly stable inorganic nanocrystals within a device.

More specifically, the coordinating ligand can have the formula:

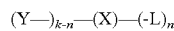

wherein k is 2, 3 or 5, and n is 1, 2, 3, 4 or 5 such that k-n is not less than zero; X is O, S, S=O, SO2, Se, Se=O, N, N=O, P, P=O, As, or As=O; each of Y and L, independently, is aryl, heteroaryl, or a straight or branched C2-12 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N($R_a$)—, —N($R_a$)—C(O)—O—, —O—C(O)—N($R_a$)—, N($R_a$)—C(O)—N($R_b$)—, —O—C(O)—O—, —P($R_a$)—, or —P(O)($R_a$)—. Each of $R_a$ and $R_b$, independently, is hydrogen, alkyl, alkenyl, alkynyl, alkoxy, hydroxyalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry, which is hereby incorporated by reference in its entirety.

Other ligands are described in U.S. patent application Ser. No. 10/641,292 for "Stabilized Semiconductor Nanocrystals", filed 15 Aug. 2003, which is hereby incorporated herein by reference in its entirety.

When the electron and hole localize on a semiconductor nanocrystal, emission can occur at an emission wavelength. The emission has a frequency that corresponds to the band gap of the quantum confined semiconductor material. The band gap is a function of the size of the semiconductor nanocrystal. Semiconductor nanocrystals having small diameters can have properties intermediate between molecular and bulk forms of matter. For example, semiconductor nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of semiconductor nanocrystals shift to the blue, or to higher energies, as the size of the crystallites decreases.

The emission from a semiconductor nanocrystal can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, CdSe can be tuned in the visible region and InAs can be tuned in the infra-red region. The narrow size distribution of a population of semiconductor nanocrystals can result in emission of light in a narrow spectral range. The population can be monodisperse preferably exhibits less than a 15% rms (root-mean-square) deviation in diameter of the semiconductor nanocrystals, more preferably less than 10%, most preferably less than 5%. Spectral emissions in a narrow range of no greater than about 75 nm, preferably 60 nm, more preferably 40 nm, and most preferably 30 nm full width at half max (FWHM) for semiconductor nanocrystals that emit in the visible can be observed. IR-emitting semiconductor nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of semiconductor nanocrystal diameters decreases.

Semiconductor nanocrystals can have high emission quantum efficiencies such as greater than 10%, 20%, 30%, 40%, 50%, 60%, 70%, or 80%.

The narrow FWHM of semiconductor nanocrystals can result in saturated color emission. This can lead to efficient lighting devices even in the red and blue parts of the visible spectrum, since in semiconductor nanocrystal emitting devices no photons are lost to infra-red and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A device including semiconductor nanocrystals of different compositions, sizes, and/or structures can emit light in more than one narrow range of wavelengths. The color of emitted light perceived by a viewer can be controlled by selecting appropriate combinations of semiconductor nanocrystal sizes and materials in the device as well as relative subpixel currents. The degeneracy of the band edge energy levels of semiconductor nanocrystals facilitates capture and radiative recombination of all possible excitons, whether generated by direct charge injection or energy transfer. The maximum theoretical semiconductor nanocrystal lighting device efficiencies are therefore comparable to the unity efficiency of phosphorescent organic light-emitting devices. The excited state lifetime ($\tau$) of the semiconductor nanocrystal is much shorter ($\tau\sim10$ ns) than a typical phosphor ($\tau>0.1$ µs), enabling semiconductor nanocrystal lighting devices to operate efficiently even at high current density and high brightness.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

A nanomaterial can be deposited onto a material or device layer in accordance with the invention. In certain embodiments, the nanomaterial is deposited as one or more separate layers. In certain embodiments of fabricating a device, nanomaterial can be disposed between any two layers of the device. In certain embodiments, nanomaterial comprising semiconductor nanocrystals can be deposited as one or more separate emissive layers disposed between a hole transport layer and an electron transport layer. In certain embodiments, for example, nanomaterial can be disposed between two hole transport layers and/or between two electron transport layers. Each charge transport layer included in a device may further comprise one or more layers. As discussed elsewhere herein, other layers may also be included between the electron transport layers and the hole transport layers. When included in the device as a separate layer, for example, nanomaterial comprising semiconductor nanocrystals can be disposed as a continuous or substantially continuous thin film or layer. When disposed as a separate layer, the layer can be patterned or unpatterned. Preferably, the nanomaterial comprising semiconductor nanocrystals included in the device comprises a substantially monodisperse population of semiconductor nanocrystals.

In certain embodiments, nanomaterial comprising semiconductor nanocrystals is deposited at a thickness of multiple monolayers or less. For example, the thickness can be greater than three monolayers, three or less monolayers, two or less monolayers, a single monolayer, a partial monolayer, etc. The thickness of each deposited layer of nanomaterial comprising semiconductor nanocrystals may vary. Preferably, the variation of the thickness at any point of the deposited semiconductor nanocrystals is less than three monolayers, more preferably less than two monolayers, and most preferably less than one monolayer. When deposited as a single monolayer, preferably at least about 60% of the semiconductor nanocrystals are at single monolayer thickness, more preferably, at least about 80% of the semiconductor nanocrystals are at single monolayer thickness, and most preferably, at least about 90% of the semiconductor nanocrystals are at single monolayer thickness. In a light-emitting device, a monolayer can provide the beneficial light emission properties of semiconductor nanocrystals while minimizing the impact on electrical performance.

Semiconductor nanocrystals show strong quantum confinement effects that can be harnessed in designing bottom-up chemical approaches to create complex heterostructures with electronic and optical properties that are tunable with the size and composition of the semiconductor nanocrystals.

As discussed herein, in certain embodiments, nanomaterial comprising semiconductor nanocrystals can be deposited in a patterned arrangement. Patterned semiconductor nanocrystals can be used to form an array of pixels comprising, e.g., red, green, and blue, or alternatively, red, orange, yellow, green, blue-green, blue, violet, or other visible, infrared, or ultraviolet emitting, or other combinations of distinguishable wavelength emitting pixels, that are energized to produce light of a predetermined wavelength.

Generally, a device or array of devices capable of emitting a variety of colors includes a pattern of emissive materials capable of emitting different colors. Depositing nanomaterials from inks using inkjet printheads and/or other microdispensers allows such pattern to be deposited without the use of shadow masks and other patterning techniques associated with vapor phase deposition. Such deposition process also eliminates the need for a transfer step as in contact printing.

When deposited in a patterned arrangement, nanomaterial can be deposited in a pattern comprising features having at least one dimension at a micron-scale (e.g., less than 1 mm, less than 500 µm, less than 200 µm, less than 100 µm or less, less than 50 µm or less, less than 20 µm or less). Nanomaterial can also be deposited in a patterned arrangement comprising features at greater than micron-scale.

A pattern comprising deposited nanomaterial having features on the micron scale may also be referred to herein as a micropattern. A micropattern can have features on the micron scale, such as less than 1 mm, less than 500 µm, less than 200 µm, less than 100 µm, less than 50 µm, or 20 µm or less in size. A 20 µm feature size is sufficiently small for most light emitting devices and devices for other applications.

The surface on which the nanomaterial can be deposited can have dimensions of 1 cm or greater, 10 cm or greater, 100 cm or greater, or 1,000 cm or greater.

Methods in accordance with the invention are scalable and can be useful in depositing a pattern comprising one or more nanomaterials over a wide range of surface areas.

For example, the method is useful for depositing nanomaterial over very small areas (for example, 100 µm catheters) to very large areas, (for example, 12" square areas). In further example, the method is also useful for depositing nanomaterial over surfaces with dimensions such as GEN2 (360 mm×465 mm), GEN3 (550 mm×650 mm), GEN3.5 (600 mm×720 mm), GEN4 (730 mm×920 mm), GEN5 (1110 mm×1250 mm), GEN6 (1500 mm×1800 mm), GEN7 (1900 mm×2100 mm), and subsequent generations of glass that can be used, e.g., in displays. Optionally, areas onto which nanomaterial is applied can then be stitched (or tiled) together, to expand the printable area from 12" squares, to 'n×12" squares' as is frequently done in the semiconductor lithography field.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix.

Figure 2:
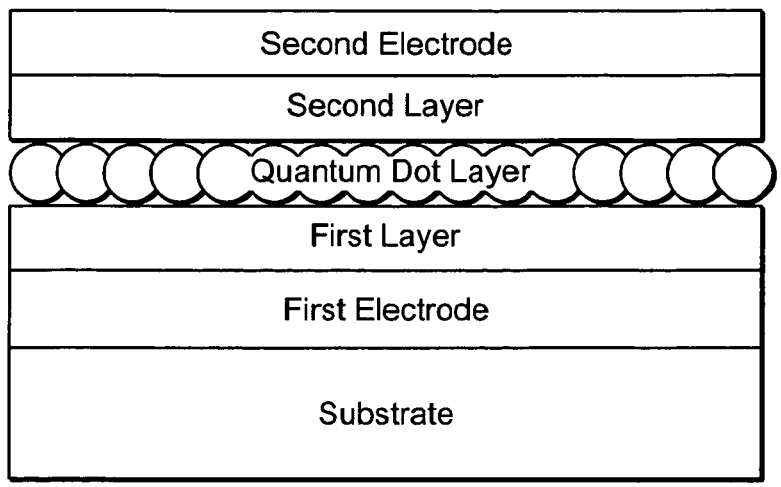
FIG. 2 depicts a schematic of an example of a structure of a light-emitting device.

An example of an embodiment of a light-emitting device is shown in FIG. 2. The depicted example includes a first electrode disposed over a substrate, a first layer in electrical connection with the first electrode, a second layer in electrical connection with the first layer, and a second electrode in electrical connection with the second layer. The first layer can comprise a material capable of transporting holes (HTL) and the second layer can comprise a material capable of transporting electrons (ETL). At least one layer can be non-polymeric. An emissive material is included between the two electrodes. The emissive material can include a plurality of semiconductor nanocrystals that can be selected based upon their light-emissive characteristics (e.g., the wavelength of the photon emitted by the nanocrystal when voltage is applied across the device). The emissive material can be included as one (as shown in FIG. 2) or more layers between the first layer and the second layer. In the figures the layer including the emissive material is designated as a "quantum dot layer". In the embodiment depicted in FIG. 2 the first electrode of the structure is in contact with the substrate. Each electrode can be connected to a power supply to provide a voltage across the structure. Electroluminescence can be produced by the semiconductor nanocrystals included in the device when a voltage of proper polarity is applied across the heterostructure.

The device structure depicted in FIG. 2 maybe fabricated as follows. A substrate having a first electrode (e.g., an anode) disposed thereon may be obtained or fabricated using any suitable technique. The first electrode may be patterned. A first layer (e.g., a hole transport layer) may be deposited using any suitable technique. An emissive layer is deposited from an ink including a nanomaterial comprising semiconductor nanocrystals and a liquid vehicle from a micro-dispenser, e.g., inkjet printhead. Inkjet printing is preferred, because it readily allows for the patterning of separate regions. In certain embodiments, the liquid vehicle of the ink is selected such that, upon removal of the liquid vehicle, the layer(s) of the device are planar (for example, utilizing a well structure such as typically used in polymer light emitting device (PLED) technology). A second layer (e.g., an electron transport layer) may be deposited using any suitable technique. A second electrode (e.g., a cathode) may be deposited using any suitable technique.

In the example shown in FIG. 2, light is emitted from the bottom of the structure (through, e.g., ITO coated glass). If an adequately light transmissive top electrode is used, the structure could emit light from the top of the structure.

Alternatively, the structure of FIG. 2 can be inverted, in which case light can be emitted from the top.

The simple layered structure illustrated in FIG. 2 is provided by way of non-limiting example, and it is understood that embodiments of the invention may be used in connection with a wide variety of other structures. The specific materials and structures described herein are exemplary in nature, and other materials and structures may be used. Functional devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be limiting.

The color of the light output of a light-emitting device can be precisely controlled by the selection of the composition, structure, and size of the various semiconductor nanocrystals included in a device as the emissive material. In certain embodiments, two or more different semiconductor nanocrystals (having different compositions, structures, and/or sizes) can be included.

Figure 3:
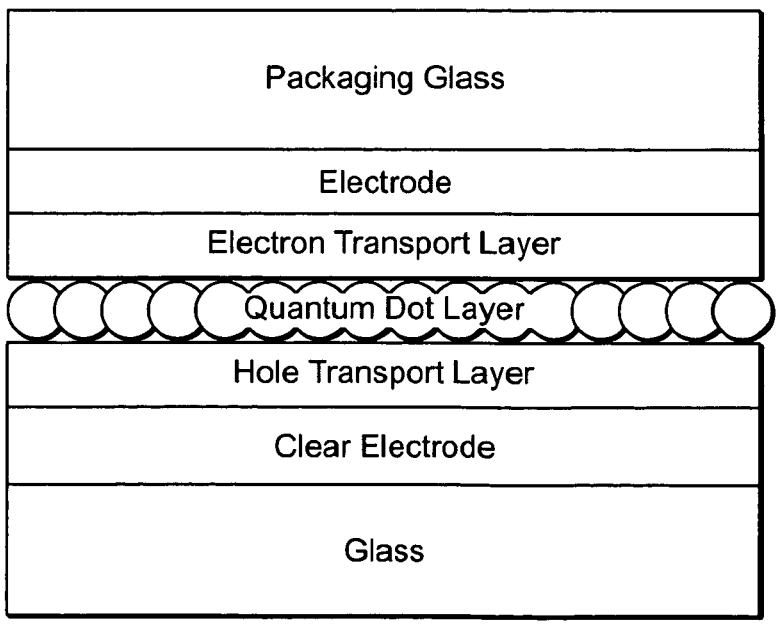
FIG. 3 depicts a schematic of an example of a structure of a light-emitting device.

FIG. 3 illustrates an example of another embodiment of a light-emitting device showing a glass substrate on which the device can be built and a protective glass layer that can be used to encapsulate the device.

Optionally a desiccant or other moisture absorptive material can be included in the device before it is sealed, e.g., with an epoxy, such as a UV curable epoxy. Other desiccants or moisture absorptive materials can be used.

The first electrode can be, for example, an anode comprising a high work function (e.g., great than 4.0 eV) hole-injecting conductor, such as an indium tin oxide (ITO) layer. Other anode materials include other high work function hole-injection conductors including, but not limited to, for example, tungsten, nickel, cobalt, platinum, palladium and their alloys, gallium indium tin oxide, zinc indium tin oxide, titanium nitride, polyaniline, or other high work function hole-injection conducting polymers. In certain embodiments, the first electrode is light transmissive or transparent. In addition to ITO, examples of other light-transmissive electrode materials include conducting polymers, and other metal oxides, low or high work function metals, conducting epoxy resins, or carbon nanotubes/polymer blends or hybrids that are at least partially light transmissive. An example of a conducting polymer that can be used as an electrode material is poly(ethlyendioxythiophene), sold by Bayer AG under the trade mark PEDOT. Other molecularly altered poly(thiophenes) are also conducting and could be used, as well as emaraldine salt form of polyaniline.

The second electrode can be, for example, a cathode comprising a low work function (e.g., less than 4.0 eV), electron-injecting, metal, such as Al, Ba, Yb, Ca, a lithium-aluminum alloy (Li:Al), a magnesium-silver alloy (Mg:Ag), or lithium fluoride-aluminum (LiF:Al). The second electrode, such as Mg:Ag, can optionally be covered with an opaque protective metal layer, for example, a layer of Ag for protecting the cathode layer from atmospheric oxidation, or a relatively thin layer of substantially transparent ITO. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

In a device such as that shown in FIG. 2, for example, the first electrode can have a thickness of about 500 Angstroms to 4000 Angstroms. The first layer can have a thickness of about 30 Angstroms to about 1000 Angstroms. The second layer can have a thickness of about 30 Angstroms to about 1000 Angstroms. The second electrode can have a thickness of about 5 Angstroms to greater than about 10,000 Angstroms.

Non-polymeric electrode materials can be deposited by, for example, sputtering or evaporating. Polymeric electrode materials can be deposited by, for example, spin-casting.

As discussed above, the electrodes can be patterned. Electrode material, including light-transmittable electrode material, can be patterned by, for example, a chemical etching method such as a photolithography or a physical etching method using laser, etc. Also, the electrode may be patterned by vacuum vapor deposition, sputtering, etc. while masking.

Hole transport and electron transport layers can be collectively referred to as charge transport layers. Either or both of these layers can comprise organic or inorganic materials. Examples of inorganic material include, for example, inorganic semiconductors. The inorganic material can be amorphous or polycrystalline. An organic charge transport material can be polymeric or non-polymeric. In certain embodiments, the charge transport materials are gradient sublimation purified.

An example of a typical organic material that can be included in an electron transport layer includes a molecular matrix. The molecular matrix can be non-polymeric. The molecular matrix can include a small molecule, for example, a metal complex. The metal complex of 8-hydroxyquinoline can be an aluminum, gallium, indium, zinc or magnesium complex, for example, aluminum tris(8-hydroxyquinoline) ($Alq_3$). Other classes of materials in the electron transport layer can include metal thioxinoid compounds, oxadiazole metal chelates, triazoles, sexithiophenes derivatives, pyrazine, and styrylanthracene derivatives. Balq2 is an example of another material that can be included in an electron transport layer. An electron transport layer comprising an organic material may be intrinsic (undoped) or doped. Doping may be used to enhance conductivity. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

An example of a typical organic material that can be included in a hole transport layer includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other hole transport layer can include N,N'-bis(3-methylphenyl)-N,N'-bis(phenyl)-spiro (spiro-TPD), 4-4'-N,N'-dicarbazolyl-biphenyl (CBP), 4,4-. bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, or an N,N,N',N'-tetraarylbenzidine. A hole transport layer comprising an organic material may be intrinsic (undoped) or doped. Doping may be used to enhance conductivity. Examples of doped hole transport layers are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

Charge transport layers comprising organic materials and other information related to fabrication of organic charge transport layers, light-emitting devices, and related technology are discussed in more detail in U.S. patent application Ser. Nos. 11/253,612 for "Method And System For Transferring A Patterned Material", filed 21 Oct. 2005, and 11/253,595 for "Light Emitting Device Including Semiconductor Nanocrystals", filed 21 Oct. 2005 and International Patent Application No. PCT/US2007/13152 for "Light-Emitting Devices And Displays With Improved Performance", filed 4 Jun. 2007. The foregoing patent applications are hereby incorporated herein by reference in its entirety.

Organic charge transport layers may be disposed by known methods such as a vacuum vapor deposition method, a sputtering method, a dip-coating method, a spin-coating method, a casting method, a bar-coating method, a roll-coating method, and other film deposition methods. In certain embodiments, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Preferably, the organic layers are deposited at high vacuum conditions of from about $1\times10^{-7}$ to about $1\times10^{-6}$ torr or from about $1\times10^{-7}$ to about $5\times10^{-6}$ torr. Alternatively, organic layers may be formed by multi-layer coating while appropriately selecting solvent for each layer.

Charge transport layers including inorganic materials and other information related to fabrication of inorganic charge transport layers are discussed further below and in more detail in U.S. Patent Application No. 60/653,094 for "Light Emitting Device Including Semiconductor Nanocrystals, filed 16 Feb. 2005 and U.S. patent application Ser. No. 11/354,185, filed 15 Feb. 2006, the disclosures of each of which are hereby incorporated herein by reference in their entireties.

Charge transport layers comprising an inorganic semiconductor can be deposited on a substrate at a low temperature, for example, by a known method, such as a vacuum vapor deposition method, an ion-plating method, sputtering, inkjet printing, etc.

The substrate can be opaque, light transmissive, or transparent. The substrate can be rigid or flexible. The substrate can be plastic, metal or glass.

In some applications, the substrate can include a backplane. The backplane includes active or passive electronics for controlling or switching power to individual pixels. Including a backplane can be useful for applications such as displays, sensors, or imagers. In particular, the backplane can be configured as an active matrix, passive matrix, fixed format, direct drive, or hybrid. The display can be configured for still images, moving images, or lighting. A display including an array of light emitting devices can provide white light, monochrome light, or color-tunable light.

In addition to the charge transport layers, a device may optionally further include one or more charge-injection layers, e.g., a hole-injection layer (HIL) (either as a separate layer or as part of the hole transport layer) and/or an electron-injection layer (EIL) (either as a separate layer as part of the electron transport layer). Charge injection layers comprising organic materials can be intrinsic (un-doped) or doped. See, for example, U.S. Provisional Patent Application No. 60/795, 420 of Beatty et al, for "Device Including Semiconductor Nanocrystals And A Layer Including A Doped Organic Material And Methods", filed 27 Apr. 2006, which is hereby incorporated herein by reference in its entirety.

One or more charge blocking layers may still further optionally be included. For example, an electron blocking layer (EBL), a hole blocking layer (HBL), or an exciton blocking layer (eBL), can be introduced in the structure. A blocking layer can include, for example, 3-(4-biphenylyl)-4-phenyl-5-tert butylphenyl-1,2,4-triazole (TAZ), 2,2',2"-(1,3,5-Benzinetriyl)-tris(1-phenyl-1-H-benzimidazole) (TBPi), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-Nphenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tertbutylphenyl)-1,3,4-oxadiazole, 1,3-bis[5-(4-(1,1-dimethylethyl)phenyl)-1,3,4-oxadiazol-5,2-yl)benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl)benzene. Charge blocking layers comprising organic materials can be intrinsic (un-doped) or doped. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

The charge injection layers (if any), and charge blocking layers (if any) can be deposited on a surface of one of the electrodes by spin coating, dip coating, vapor deposition, or other thin film deposition methods. See, for example, M. C. Schlamp, et al., J. Appl. Phys., 82, 5837-5842, (1997); V. Santhanam, et al., Langmuir, 19, 7881-7887, (2003); and X. Lin, et al., J. Phys. Chem. B, 105, 3353-3357, (2001), each of which is incorporated by reference in its entirety.

Other multilayer structures may optionally be used to improve the performance (see, for example, U.S. patent application Ser. Nos. 10/400,907 and 10/400,908, filed Mar. 28, 2003, each of which is incorporated by reference in its entirety) of the light-emitting devices and displays of the invention. The performance of light-emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety.

Preferably, a device including a nanomaterial comprising semiconductor nanocrystals is processed in a controlled (oxygen-free and moisture-free) environment, preventing the quenching of luminescent efficiency during the fabrication process.

Besides being useful to deposit nanomaterials in fabricating devices and displays, other layers of a device and/or array (e.g., electrodes, charge transport layers, charge blocking layers, charge injection layers, etc.) can also be deposited from micro-dispensers, e.g., inkjet printheads. Fabricating multiple device layers using micro-dispensers, e.g., inkjet printheads, can simplify the manufacturing process and provide other manufacturing efficiencies.

Because of the diversity of semiconductor nanocrystal materials that can be prepared, and the wavelength tuning via semiconductor nanocrystal composition, structure, and size, devices that can emit light of a predetermined color are possible with use of semiconductor nanocrystals as the emissive material. Semiconductor nanocrystal light-emitted devices can be tuned to emit anywhere in the spectrum. Light-emitting devices can be prepared that emit visible or invisible (e.g., IR) light. The size and material of a semiconductor nanocrystal can be selected such that the semiconductor nanocrystal emits light having a predetermined wavelength. Light emission can be of a predetermined wavelength in any region of the spectrum, e.g., visible, infrared, etc. For example, the wavelength can be between 300 and 2,500 nm or greater, for instance between 300 and 400 nm, between 400 and 700 nm, between 700 and 1100 nm, between 1100 and 2500 nm, or greater than 2500 nm.

In certain embodiments, individual light-emitting devices can be formed. In other embodiments, a plurality of individual light-emitting devices can be formed at multiple locations on a single substrate to form a display.

A display can include two or more devices that emit at the same or different wavelengths. By patterning the substrate with arrays of nanomaterials comprising different color-emitting semiconductor nanocrystals, a display including pixels of different colors can be formed. Patterned semiconductor nanocrystals can be used to form an array of pixels comprising, e.g., red, green, and blue or alternatively, red, yellow, green, blue-green, and/or blue emitting, or other combinations of distinguishable color emitting pixels, that are energized to produce light of a predetermined wavelength. In certain embodiments, one or more pixel can emit in the ultraviolet or infrared emission portion of the spectrum.

An individual light-emitting device or one or more light-emitting devices of a display can optionally include a mixture of different color-emitting semiconductor nanocrystals formulated to produce a white light. White light can alternatively be produced from a device including red, green, blue, and, optionally, additional pixels.

Examples of other displays are included in U.S. Patent Application No. 60/771,643 for "Displays Including Semiconductor Nanocrystals And Methods Of Making Same", of Seth Coe-Sullivan et al., filed 9 Feb. 2006, the disclosure of which is hereby incorporated herein by reference in its entirety.

As discussed above, the methods described herein may have applications in fabricating other devices in addition to light-emitting devices, including, but not limited to, solar cells, photovoltaic devices, photodetectors, non-volatile memory devices, etc.

For example, a nanomaterial, e.g., a nanomaterial comprising semiconductor nanocrystals, can be deposited by a method in accordance with the invention in fabrication of a photodetector device or array of photodetector devices. A photodetector device includes one or more nanomaterials comprising a plurality of semiconductor nanocrystals which are selected based upon absorption properties. When included in a photodetector, semiconductor nanocrystals are engineered to produce a predetermined electrical response upon absorption of a particular wavelength, typically in the IR or MIR region of the spectrum. Examples of photodetector devices including semiconductor nanocrystals are described in "A Quantum Dot Heterojunction Photodetector" by Alexi Cosmos Arango, Submitted to the Department of Electrical Engineering and Computer Science, in partial fulfillment of the requirements for the degree of Masters of Science in Computer Science and Engineering at the Massachusetts Institute of Technology, February 2005, the disclosure of which is hereby incorporated herein by reference in its entirety. One or more photodetectors can further be included in an imaging device, such as an hyperspectral imaging device. See, for example, U.S. Provisional Application No. 60/785,786 of Coe-Sullivan et al. for "Hyperspectral Imaging Device", filed 24 Mar. 2006, the disclosure of which is hereby incorporated herein by reference in its entirety.

In one embodiment, a method of fabricating a photodetector device includes depositing an ink comprising a nanomaterial and a liquid vehicle onto a layer of the device from a micro-dispenser. In one embodiment, the nanomaterial comprises semiconductor nanocrystals. The ink can be deposited onto the layer of the device in a predetermined patterned arrangement or as an unpatterned arrangement, including, only by way of example, a layer, a continuous film, etc. Preferably the liquid vehicle is removed from the deposited ink before deposition of any other material or layer thereover.

In another embodiment, a method of fabricating an array of photodetector devices includes depositing an ink comprising a nanomaterial and a liquid vehicle onto a layer of the device from a micro-dispenser. In one embodiment, the nanomaterial comprises semiconductor nanocrystals. The ink comprising a nanomaterial and a liquid vehicle can be deposited on the device layer in a predetermined arrangement (patterned or unpatterned). The device layer can be disposed on a substrate that further includes an electrode. A second electrode can be deposited over the deposited nanomaterial, preferably after removal of the liquid vehicle from the ink. In one embodiment, the device layer onto which the nanomaterial is deposited comprises a charge transport material. Optionally, a second charge transport layer can be formed between the nanomaterial layer and the second electrode.

A method of fabricating a photodetector device or array of devices can optionally include depositing one or more nanomaterials in a predetermined arrangement (patterned or unpatterned). As discussed above, an ink including a nanomaterial and a liquid vehicle is deposited from a micro-dispenser.

Methods in accordance with the invention can also be used in deposition nanomaterials in the fabrication of memory devices. An example of a nonvolatile device is described in U.S. patent application Ser. No. 10/958,659, for "Non-Volatile Memory Device", of Bawendi et al., filed 6 Oct. 2004, the disclosure of which is hereby incorporated herein by reference in its entirety.

For additional information relating to semiconductor nanocrystals and their use, see also U.S. Patent Application Nos. 60/620,967, filed Oct. 22, 2004, and 11/032,163, filed Jan. 11, 2005, U.S. patent application Ser. No. 11/071,244, filed 4 Mar. 2005. Each of the foregoing patent applications is hereby incorporated herein by reference in its entirety.

As used herein, "top" and "bottom" are relative positional terms, based upon a location from a reference point. More particularly, "top" means furthest away from the substrate, while "bottom" means closest to the substrate. For example, for a light-emitting device that optionally includes two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, the first layer is disposed further away from substrate. There may be other layers between the first and second layer, unless it is otherwise specified. For example, a cathode may be described as "disposed over" an anode, even though there are various organic and/or inorganic layers in between.

As used herein, the singular forms "a", "an" and "the" include plural unless the context clearly dictates otherwise. Thus, for example, reference to a nanomaterial includes reference to one or more of such materials.

All the patents and publications mentioned above and throughout are incorporated in their entirety by reference herein. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method for making a light-emitting device including an emissive material including a nanomaterial comprising quantum confined semiconductor nanocrystals that emit light having a predetermined wavelength comprising:
   providing a substrate including a first electrode,
   disposing a first layer over the substrate including the first electrode;
   depositing an ink comprising the nanomaterial comprising the quantum confined semiconductor nanocrystals and a liquid vehicle over a surface of the first layer from a micro-dispenser in a predetermined arrangement; and
   disposing a second electrode over the predetermined arrangement,
wherein the first layer comprises a material which is at least partially soluble in the liquid vehicle, wherein at least a portion of the nanomaterial is at least temporarily mixed in a portion of the material that dissolves in the ink, and wherein the liquid vehicle is removed such that the nanomaterial phase separates to form a layer of nanomaterial at the surface of the first layer.

2. A method in accordance with claim 1 wherein the first layer comprises a material capable of transporting holes.

3. A method in accordance with claim 1 wherein the micro-dispenser comprises an inkjet printhead and the ink is deposited by inkjet processing.

4. A method in accordance with claim 3 further comprising removing the liquid vehicle from the ink and disposing a second layer comprising a material capable of transporting electrons over the predetermined arrangement before disposing the second electrode.

5. A method in accordance with claim 1 wherein each of the first layer and the nanomaterial layer of the device is formed by inkjet processing.

6. A method in accordance with claim 4 wherein each of the first layer, the nanomaterial layer, and the second layer of the device is formed by inkjet processing.

7. A method in accordance with claim 1 further comprising disposing one or more additional layers before disposing the second electrode layer.

8. A method in accordance with claim 7 wherein each of the first layer, the nanomaterial layer, the one or more additional layers, and second electrode layer of the device is formed by inkjet processing.

9. A method in accordance with claim 7 further comprising packaging the device.

10. A method in accordance with claim 9 wherein a desiccant material is included in the device before the packaging is completed.

11. A method in accordance with claim 1 further comprising disposing a layer comprising a hole injection material over the substrate before the first layer is disposed over the substrate.

12. A method in accordance with claim 11 wherein all layers of the device other than the first electrode are formed by inkjet processing.

13. A method in accordance with claim 1, wherein the layer comprising the nanomaterial comprises two or more nanomaterials, wherein each nanomaterial comprises quantum confined semiconductor nanocrystals and the emission characteristics of each nanomaterial are distinguishable from those of another nanomaterial, and wherein the two or more nanomaterials are patterned into distinct regions.

14. A method in accordance with claim 1 wherein the liquid vehicle is removed from the ink such that at least a portion of the material and the nanomaterial remain mixed.

\* \* \* \* \*

UNITED STATES PATENT AND TRADEMARK OFFICE
CERTIFICATE OF CORRECTION

| | | |
|---|---|---|
| PATENT NO. | : 8,618,561 B2 | Page 1 of 1 |
| APPLICATION NO. | : 12/317250 | |
| DATED | : December 31, 2013 | |
| INVENTOR(S) | : Coe-Sullivan | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 0 days.

Signed and Sealed this
Twenty-second Day of April, 2014

Michelle K. Lee
*Deputy Director of the United States Patent and Trademark Office*